United States Patent
Ikeda

(10) Patent No.: US 8,125,067 B2
(45) Date of Patent: Feb. 28, 2012

(54) METHOD FOR FORMING TERMINAL OF STACKED PACKAGE ELEMENT AND METHOD FOR FORMING STACKED PACKAGE

(75) Inventor: Masato Ikeda, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 231 days.

(21) Appl. No.: 12/523,245

(22) PCT Filed: Mar. 20, 2007

(86) PCT No.: PCT/JP2007/055717
§ 371 (c)(1),
(2), (4) Date: Jul. 15, 2009

(87) PCT Pub. No.: WO2008/114430
PCT Pub. Date: Sep. 25, 2008

(65) Prior Publication Data
US 2010/0038766 A1 Feb. 18, 2010

(51) Int. Cl.
*H01L 25/11* (2006.01)
(52) U.S. Cl. ........ 257/686; 257/678; 257/679; 257/633; 257/E25.027; 257/E21.499; 438/107; 438/613
(58) Field of Classification Search .......... 257/678–733, 257/768–796, E23.001–E23.194
See application file for complete search history.

(56) References Cited

U.S. PATENT DOCUMENTS

| 7,391,106 B2 | 6/2008 | Kang | 257/686 |
| 2003/0180451 A1 | 9/2003 | Kodas et al. | 427/123 |
| 2005/0167812 A1* | 8/2005 | Yoshida et al. | 257/686 |

FOREIGN PATENT DOCUMENTS

| JP | 2001-085458 | 3/2001 |
| JP | 2001-135785 | 5/2001 |
| JP | 2004-303884 | 10/2004 |
| WO | WO 03/032084 | 4/2003 |

* cited by examiner

Primary Examiner — Nathan W. Ha
Assistant Examiner — Mamadou Diallo
(74) Attorney, Agent, or Firm — Bacon & Thomas, PLLC

(57) ABSTRACT

A semiconductor chip module having high degree of freedom in assignment of a circuit to each semiconductor chip and in position of a connection terminal of each semiconductor chip is provided. The present invention relates to a semiconductor chip module in which a plurality of semiconductor chips, each provided on the side face thereof with a part of a connection terminal coupled with a circuit pattern formed on the front face, have been stacked and bonded. Connection terminal portions on the side faces of the respective semiconductor chips are interconnected by a wiring pattern. The connection terminal on the semiconductor chip is led from the front face to the side face and formed by applying spraying of a conductive material in a mist state.

5 Claims, 6 Drawing Sheets

METHOD FOR FORMING TERMINAL OF STACKED PACKAGE ELEMENT AND METHOD FOR FORMING STACKED PACKAGE

TECHNICAL FIELD

The present invention relates to a stacked package element, a method for forming a terminal of a stacked package element, a stacked package, and an inter-terminal wiring method for a stacked package, which are applicable for manufacturing a semiconductor chip module in which plural semiconductor chips have been integrated in a stacked state, for example.

BACKGROUND ART

In order to deal with requirements for a recent high-density trend of a semiconductor chip (LSI) and readily deal with requirements for partial specification changes, a three-dimensional semiconductor chip module in which plural semiconductor chips have been stacked, integrated, and electrically interconnected has been proposed.

In conventional three-dimensional semiconductor chip modules, electrical connection among semiconductor chips has been established with use of a through hole (refer to Patent Document 1) or with use of an end face (side face) of a semiconductor chip (refer to Patent Document 2).

Patent Document 1: Japanese Patent Laid-Open No. 2001-135785
Patent Document 2: Japanese Patent Laid-Open No. 2007-19484

DISCLOSURE OF THE INVENTION

Problems to be Solved by the Invention

In a method for electrically connecting semiconductor chips with use of a through hole, a defect such as a crack easily occurs in a semiconductor chip since a through hole is provided in the extremely small semiconductor chip, and even when an electrical connection error occurs among the semiconductor chips in a semiconductor chip module in which the semiconductor chips are stacked and connected, the part is hard to discover and is hard to repair even if it is discovered since the connection is via through holes, which cannot be seen from outside.

A method for electrically connecting semiconductor chips with use of an end face (side face) of a semiconductor chip does not have the above problems.

However, as for connection terminals going across the front face, side face, and back face of the semiconductor chip, ones on the front face and back face are formed at the time of forming the own pattern for the semiconductor chip while one on the side face is formed separately at different forming timing (and in a different forming method), and thus connection between the connection terminal portions on the front face and back face and the connection terminal portion on the side face may be insufficient (a defect is easy to occur in electrical connection at the edge portion between the front face and the side face), or electrical characteristics in the terminals (e.g., resistance values) may extend beyond a desired range. For reference, as the side face of the semiconductor chip is significantly rough-edged in a state of being cut out of a wafer, it undergoes a smoothing process, and thereafter the connection terminal portion is formed on it by etching, adhesion of foils, etc.

Also, either in the case of using the through hole or in the case of using the side face, it is generally the case that adjacent semiconductor chips are electrically connected via the connection terminal portions, which causes low degree of freedom in arrangement position of the connection terminal portions. Also, between the semiconductor chips that are not adjacent to each other, the connection terminals cannot be connected to one another, and thus a circuit kind in a connection relationship is assigned between the adjacent semiconductor chips, which causes low degree of freedom in circuit kind to be assigned to each semiconductor chip.

The present invention has been made with a view to the above respects, and an object of the present invention is to provide a method for forming a terminal of a stacked package element enabling to form a connection terminal on each of the stacked package elements stacked one another with high reliability while assuring achievement of desired electrical characteristics and a stacked package element having formed thereon a connection terminal by this method.

Also, an object of the present invention is to provide a stacked package and a method for forming a stacked package enabling to reduce restriction in position of a connection terminal on a stacked package element and restriction in assignment of a circuit to each stacked package element.

Means to Solve the Problems

A first aspect of the invention is a stacked package in which a plurality of stacked package elements, each provided on the side face thereof with a part of a connection terminal coupled with a circuit pattern formed on the front face, have been stacked and bonded, wherein connection terminal portions on the side faces of the respective stacked package elements are interconnected by a wiring pattern.

A second aspect of the invention is a method for forming a stacked package in which a plurality of stacked package elements, each provided on the side face thereof with a part of a connection terminal coupled with a circuit pattern formed on the front face, have been stacked and bonded, comprising (1) a first step of forming on each of the stacked package elements the connection terminal led at least from the front face to the side face to be coupled with the circuit pattern formed on the front face, (2) a second step of stacking and bonding the plurality of stacked package elements on each of which the connection terminal has been formed, and (3) a third step of interconnecting connection terminal portions on the side faces of the bonded respective stacked package elements by a wiring pattern formed by applying spraying of a conductive material in a mist state and changing of a position to be sprayed.

A third aspect of the invention is a stacked package element stacked and bonded to constitute a stacked package, wherein a connection terminal coupled with a circuit pattern formed on the front face is one led from the front face to the side face.

A fourth aspect of the invention is a stacked package element stacked and bonded to constitute a stacked package, wherein a connection terminal coupled with a circuit pattern formed on the front face and led at least from the front face to the side face is one formed by applying spraying of a conductive material in a mist state and changing of a position to be sprayed.

A fifth aspect of the present invention is a method for forming a terminal of a stacked package element stacked and bonded to constitute a stacked package, the method forming a connection terminal coupled with a circuit pattern formed on the front face and led at least from the front face to the side face, wherein the connection terminal portion is formed by applying spraying of a conductive material in a mist state and changing of a position to be sprayed.

Effect of the Invention

With the present invention, a connection terminal on each of stacked package elements stacked one another can be formed with high reliability while assuring achievement of desired electrical characteristics.

Also, with the present invention, it is possible to reduce restriction in position of a connection terminal on a stacked package element and restriction in assignment of a circuit to each stacked package element.

DESCRIPTION OF THE SYMBOLS

10 . . . wiring forming apparatus, 50 . . . semiconductor wafer, 52 . . . semiconductor chip, 54 . . . connection terminal, 56 . . . three-dimensional semiconductor chip module, 58 . . . interlayer wiring

BEST MODE FOR CARRYING OUT THE INVENTION (A) Principal Embodiment

Hereinafter, one embodiment of a stacked package element, a method for forming a terminal of a stacked package element, a stacked package, and a method for forming a stacked package is explained with reference to the drawings.

A stacked package according to the present embodiment is a three-dimensional semiconductor chip module (LSI module), and a stacked package element according to the present embodiment is a semiconductor chip (LSI).

(A-1) Wiring Forming Apparatus Applied to Formation of Terminal and Side Face Wiring First, a wiring forming apparatus for use in formation of a terminal of a semiconductor chip and in formation of wiring among semiconductor chips (among layers) of a semiconductor chip module, described later, is explained.

Figure 2:
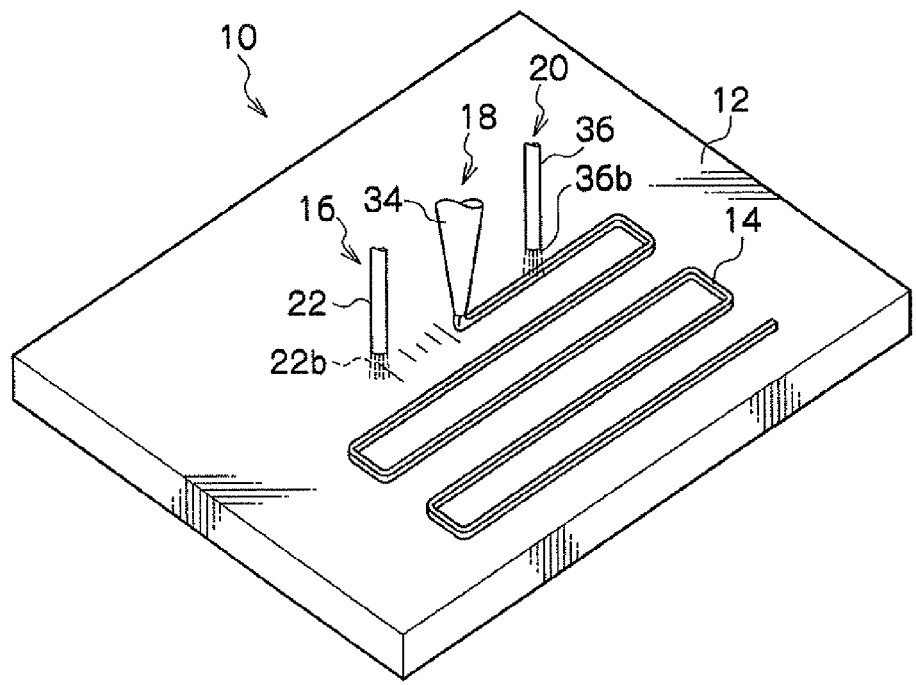
FIG. 2 is a partial schematic view showing one example of a wiring forming apparatus for use in the embodiment.

FIG. 2 is a partial schematic view showing one example of a wiring forming apparatus 10 for use in formation of a terminal of a semiconductor chip and in formation of wiring among terminals of semiconductor chips of a semiconductor chip module.

FIG. 2 shows a use state in which the wiring forming apparatus 10 forms wiring 14 on an object under wiring formation (hereinafter referred to as an insulating substrate in explanation in FIG. 2) 12 in consideration of simplification of explanation on the wiring forming apparatus 10. However, a use state when a terminal for extraction is formed on a semiconductor chip as described later and a use state when wiring is formed to connect connection terminals to one another among semiconductor chips as described later slightly differ from FIG. 2. That is, FIG. 2 is a view just to explain the wiring forming apparatus 10.

The wiring forming apparatus 10 includes a purifying atmospheric plasma generating unit 16, a paste material attaching unit 18, and an oxygen radical molecule jetting unit 20.

Figure 3:
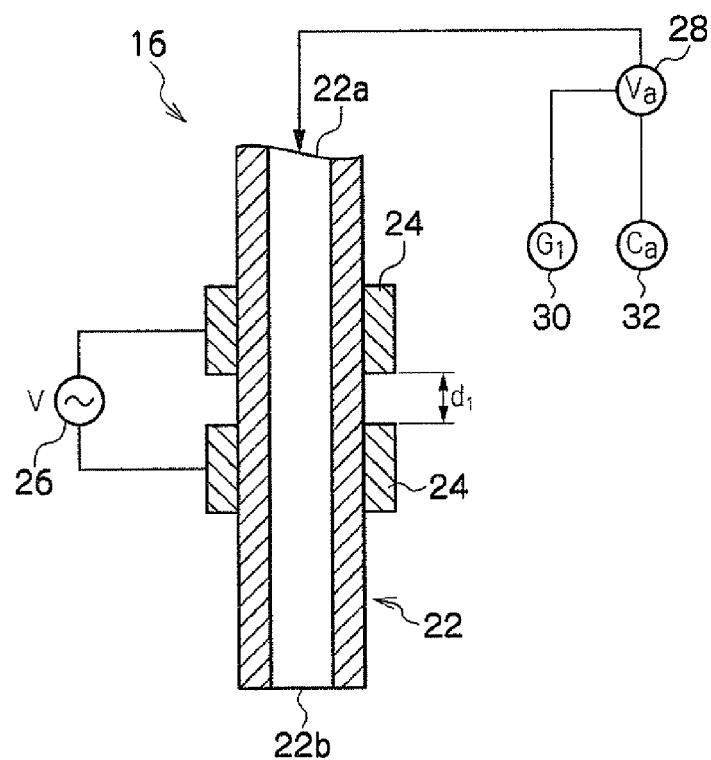
FIG. 3 is a schematic view showing a structure of a purifying atmospheric plasma generating unit in FIG. 2.

The purifying atmospheric plasma generating unit 16 comprises a dielectric tube 22 made of a dielectric such as glass whose upper end is an inlet 22a of gas 20, and whose lower end is a plasma jetting outlet 22b, a pair of electrodes 24, 24 arranged to leave a distance d1 from each other in the longitudinal direction of the dielectric tube 22 and arranged to each surround the dielectric tube 22, and a power unit 26 for applying alternating voltage or pulse voltage between these electrodes, as shown in FIG. 3.

To the gas inlet 22a of the dielectric tube 22, reducing gas G1 such as carbon monoxide gas or hydrogen gas and carrier gas Ca such as nitrogen, argon, or the like can be guided via an opening and closing valve 28. As for the dielectric tube 22, its plasma jetting outlet 22b is directed to the surface of the insulating substrate 12 on which the wiring 14 is to be formed as shown in FIG. 2.

When the opening and closing valve 28 is opened, the carrier gas Ca from a carrier gas source 32 and the reducing gas G1 from a reducing gas source 30 are guided in the dielectric tube 22 toward its plasma jetting outlet 22b. On the flow path of the dielectric tube 22 in which the reducing gas G1 is guided, a discharge space area by dielectric barrier discharge is formed by the pair of electrodes 24, 24 to which voltage is applied from the power unit 26 at an area corresponding to the distance d1 between the two electrodes. Thus, the reducing gas G1 guided from the gas inlet 22a toward the plasma jetting outlet 22b of the dielectric tube 22 comes into a plasma state in the process of passing through this discharge space area. As a result, plasma gas in which this reducing gas G1 is a plasma source is jetted on the insulating substrate 12.

By this jet of the plasma gas from the dielectric tube 22, oxide remaining at a part receiving irradiation of this plasma gas is effectively removed by chemical reaction with this plasma gas. At this time, in the atmospheric plasma in which the reducing gas G1 is a plasma gas source, since the temperature at the irradiated part is maintained at 60 to 80 degrees centigrade, no damage caused by heating is given to the irradiated part and its periphery on the insulating substrate 12.

The dielectric tube 22 or the atmospheric plasma jetting nozzle 22 of the purifying atmospheric plasma generating unit 16 can be moved automatically along a desired pattern with use of a known automatic control mechanism although not shown in the figure. Meanwhile, instead of the atmospheric plasma jetting nozzle 22, the insulating substrate 12 side may be moved automatically along a desired pattern with use of a known automatic control mechanism. That is, a relative movement method between the atmospheric plasma jetting nozzle 22 and the insulating substrate 12 may adopt any of various known methods.

To the area on the insulating substrate 12 purified by jet of the atmospheric plasma gas in which the reducing gas G1 is a plasma gas source, a paste material is supplied from a jetting outlet of a nozzle 34 of the paste material attaching unit 18. By letting the nozzle 34 of the paste material attaching unit 18 follow the nozzle 22 of the purifying atmospheric plasma generating unit 16, the paste material can be supplied and attached in a line form (in a straight or curved line) sequentially on the purified area on the insulating substrate 12.

The paste material, which is a raw material to form the wiring 14, contains nano metal particles and a binder made of organic materials.

The nano metal particle in the paste material is a metal fine particle such as gold or silver showing favorable conductivity with a particle diameter of several nanometers to several hundreds nanometers. Such a metal fine particle has extremely high surface energy, and thus when the metal fine particles contact one another directly, metal sintering occurs by this contact.

The binder in the paste material acts not only to heighten attachment force of the paste material on the insulating substrate 12 but also to protect the metal fine particles from sintering by preventing direct contact between the nano metal particles so as to prevent unnecessary and unexpected metal sintering. Such a binder is conventionally well known as an organic binder and is made of organic materials such as oxygen, carbon, hydrogen, and nitrogen. Also, for the purpose of heightening the protection action by the binder, it is preferable to cover the surface of each nano metal particle with a protective film of the binder.

For such a paste material, "NanoPaste" for sale in Harima Chemicals, Inc. is preferably used.

As a method for attaching the paste material to the insulating substrate 12, a method of spraying the paste material in a mist state by a nozzle using a similar method to an ink jet method (hereinafter referred to as mist jet) can be applied, for example. Also, the paste material may be attached to the insulating substrate appropriately by using an M3D (trademark) unit or another unit. Also, for attachment of the paste material to a desired part, a selection mask that selectively exposes the desired part can be used. Further, other printing methods may be applied. Meanwhile, the M3D (trademark) unit is a Maskless Mesoscale Material Deposition unit (U.S. Pat. No. 7,045,015) by Optomec, Inc, United States.

In the case of the mist jet process, jet from the nozzle 34 can be narrowed jet formed in a spiral shape to form linear wiring.

The wiring forming apparatus 10 is used for formation of a terminal of a semiconductor chip and for formation of wiring among terminals of semiconductor chips of a semiconductor chip module, as described later. For the former formation, the method of attaching the paste material in a mist state is preferably applied since the distance between the nozzle 34 of the paste material attaching unit 18 and the attachment surface of an object under formation changes. For the latter formation, any attachment method may be used.

The wiring pattern portion 14 formed with the paste material in a line form on the insulating substrate 12 receives irradiation of oxygen radical molecules by the oxygen radical molecule jetting unit 20.

Figure 4:
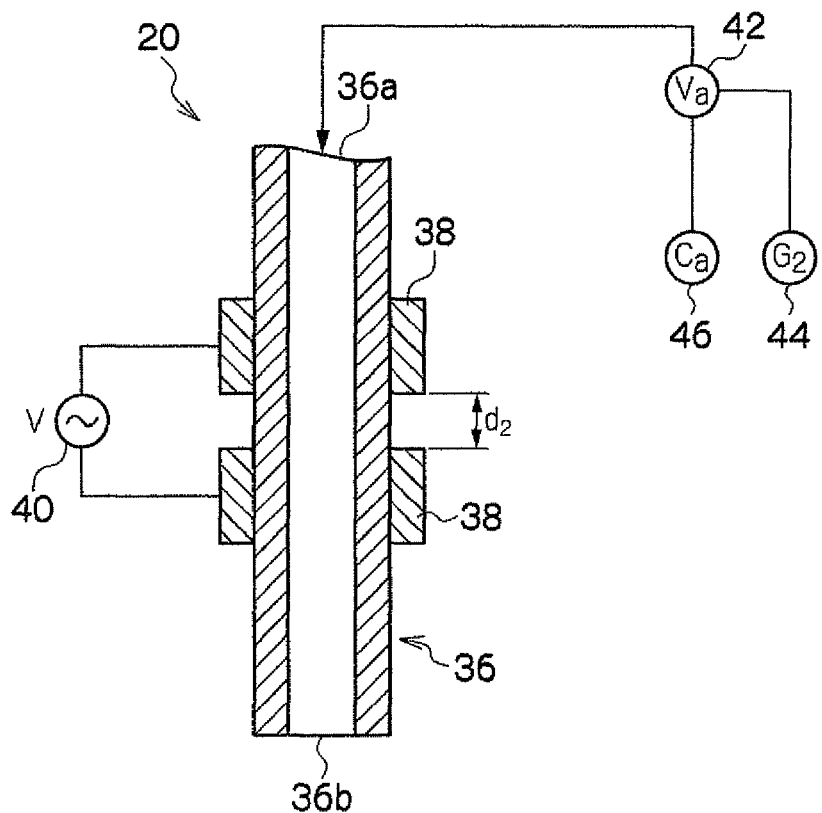
FIG. 4 is a schematic view showing a structure of an oxygen radical molecule jetting unit in FIG. 2.

This oxygen radical molecule jetting unit 20 is structured as shown in FIG. 4, for example, and basically, an atmospheric plasma generating unit having a similar structure to the atmospheric plasma generating unit 16 shown in FIG. 3 is used. The fundamental difference between the two units 16 and 20 is a respect in which the purifying atmospheric plasma generating unit 16 uses the reducing gas source 30 as a plasma gas source while the atmospheric plasma generating unit used as the oxygen radical molecule jetting unit 20 uses an oxide gas source such as oxygen or air as a plasma gas source.

That is, the atmospheric plasma generating unit 20 used as an oxygen radical molecule jetting unit comprises a dielectric tube 36 made of a dielectric such as glass, a pair of electrodes 38, 38 arranged to leave a distance d2 from each other in the longitudinal direction of the dielectric tube 36 and arranged to each surround the dielectric tube 36, and a power unit 40 for applying alternating voltage or pulse voltage between these electrodes, as shown in FIG. 4. Also, to a gas inlet 36a, which is an upper end of the dielectric tube 36, oxide gas G2 such as oxygen gas or air and carrier gas Ca such as nitrogen, argon, or the like are guided via an opening and closing valve 42. As for the dielectric tube 36, its plasma jetting outlet 36b is directed to the formed wiring portion as shown in FIG. 2.

When the opening and closing valve 42 is opened, the carrier gas Ca from a carrier gas source 46 and the oxide gas G2 from an oxide gas source 44 are guided in the dielectric tube 36 toward its plasma jetting outlet 36b. On the flow path of the dielectric tube 36 in which the oxide gas G2 is guided, a discharge space area by dielectric barrier discharge is formed at an area corresponding to the distance d2 between the pair of electrodes 38, 38 to which voltage is applied from the power unit 40. Thus, as in the case of the aforementioned atmospheric plasma generating unit 16, the oxide gas G2 guided from the gas inlet 36a toward the plasma jetting outlet 36b of the dielectric tube 36 comes into a plasma state in the process of passing through this discharge space area.

When the plasma in which the oxide gas G2 is a plasma source is jetted on the insulating substrate 12, oxygen radical contained in the plasma reacts chemically with the organic binder in the paste material of the wiring portion just attached. As a result, the organic binder is removed mainly by the chemical reaction with the oxygen radical. When the organic binder is removed from the wiring portion formed by the aforementioned paste material, the nano metal particles in the wiring portion contact mutually. When this mutual contact occurs, the nano metal particles are sintered by the surface energy of the nano metal particles as described above, and the wiring 14 is formed.

It is preferable to let the dielectric tube of the oxygen radical molecule jetting unit 20, that is to say, the nozzle 36, follow the nozzle 34 of the paste material attaching unit 18 with a predetermined space from the nozzle 34.

Also, it is preferable to lower the temperature of the plasma gas flow jetted from the plasma jetting outlet 36b of the dielectric tube 36 as much as possible for the purpose of raising the content rate of the oxygen radical molecules in the plasma gas jetted from the nozzle 36 of the atmospheric plasma generating unit 20 in which the oxide gas G2 is a plasma gas source and for the purpose of restricting unnecessary temperature rise of the insulating substrate 12. Setting the temperature of the plasma flow jetted from the plasma jetting outlet 36b at 200 degrees centigrade, for example, raises the content rate of the oxygen radical molecules, thereby enabling to remove the organic binder in the wiring portion effectively without causing heating at the periphery and enabling to sinter the nano metal particles by spraying of the plasma gas for a short period of 30 seconds or so.

As for the operation conditions of the respective atmospheric plasma generating units 16, 20, at least either the rise time or the fall time of voltage to be applied to the pairs of electrodes 24, 24 and 38, 38 from the power units 26, 40 can be selected from within the range of 100 microseconds or less, the repetition frequency of the waveform of voltage V from the power units 26, 40 can be selected from within the range of 0.5 to 1000 kHz, and the field intensity applied between the pairs of electrodes 24, 24 and 38, 38 can be selected from within the range of 0.5 to 200 kV/cm, for example. Also, it is preferable to adjust the distance between the plasma jetting outlets 22b, 36b of the respective nozzles 22, 36 and the insulating substrate 12 in the range of 1 to 20 mm, for example.

As each of the plasma generating units 16, 20, a vacuum plasma generating unit may be used. However it is preferable to use an atmospheric plasma generating unit in order to enable to perform the process in the atmosphere without arranging the insulating substrate 12 under process in a vacuum chamber and to simplify the work and the unit by using the aforementioned atmospheric plasma generating unit.

Also, instead of spraying the oxygen radical molecules to the wiring portion formed with the paste material containing the nano metal particles and the binder made of organic materials, spraying active oxygen (ozone) or gas containing it can remove the organic binder in the paste material and thus contact one another and sinter the nano metal particles in the paste material.

Meanwhile, depending on the state of the insulating substrate 12, the purifying process may be omitted. In this case, one that does not comprise the purifying atmospheric plasma generating unit 16 can be applied as the wiring forming apparatus 10.

Also, by using a similar structure to the paste material attaching unit 18 of the aforementioned wiring forming apparatus 10 and adopting one containing an insulating substance as a paste material, an insulating layer or an insulating pattern can be formed by mist jet, for example. In this case, curing of the insulating layer or the insulating pattern is done by ultraviolet irradiation, for example. In this case, an ultraviolet irradiating unit will be provided at the position of the atmospheric plasma generating unit 20.

(A-2) Overview of Process for Manufacturing Three-Dimensional Semiconductor Chip Module Next, a process for manufacturing a three-dimensional semiconductor chip module in the present embodiment is explained with reference to FIG. 1. The following explanation clarifies positions (order) of a process for forming a terminal of a semiconductor chip and a process for forming wiring among semiconductor chips (among layers) of a semiconductor chip module in a process for manufacturing a three-dimensional semiconductor chip module.

For example, a semiconductor wafer 50 on the surface of which circuit patterns of plural semiconductor chips have been formed is diced into individual semiconductor chips 52 by dicing. It is to be noted that only circuit patterns of the semiconductor chips that will be in the same layer when they are stacked are preferably formed on one wafer 50 (in other words, circuit patterns of the semiconductor chips that are in different layer positions of the stack are not formed on the same semiconductor wafer).

To each semiconductor chip 52 is formed a connection terminal 54 (54a, 54b) continuously extending over a front face 52a and a side face 52b. Meanwhile, the end portion on the non-side-face side of the connection terminal 54a on the front face 52a is electrically connected to the end portion (pad, not shown) of a formed circuit pattern.

Here, it is preferable that the angle formed by the front face 52a and the side face 52b of the semiconductor chip 52 on which the connection terminal 54 is to be formed should be an obtuse angle although it may be a right angle so as to enable to reduce a defect of the connection terminal 54 at the edge portion. It is also preferable to chamfer the edge portion to some extent. In this case, a process of inclining the side face or chamfering is performed to each diced semiconductor chip 52 in advance before the connection terminal 54 is formed on it. As a process of inclining the side face, end face polishing can be raised. Although FIG. 1 shows a case in which only a face on which the connection terminal 54 is to be formed has been inclined, a face on which no connection terminal 54 is formed may be inclined as well.

Meanwhile, the side face may be smoothed through the inclining process to dispense with the aforementioned purifying process.

Figure 1:
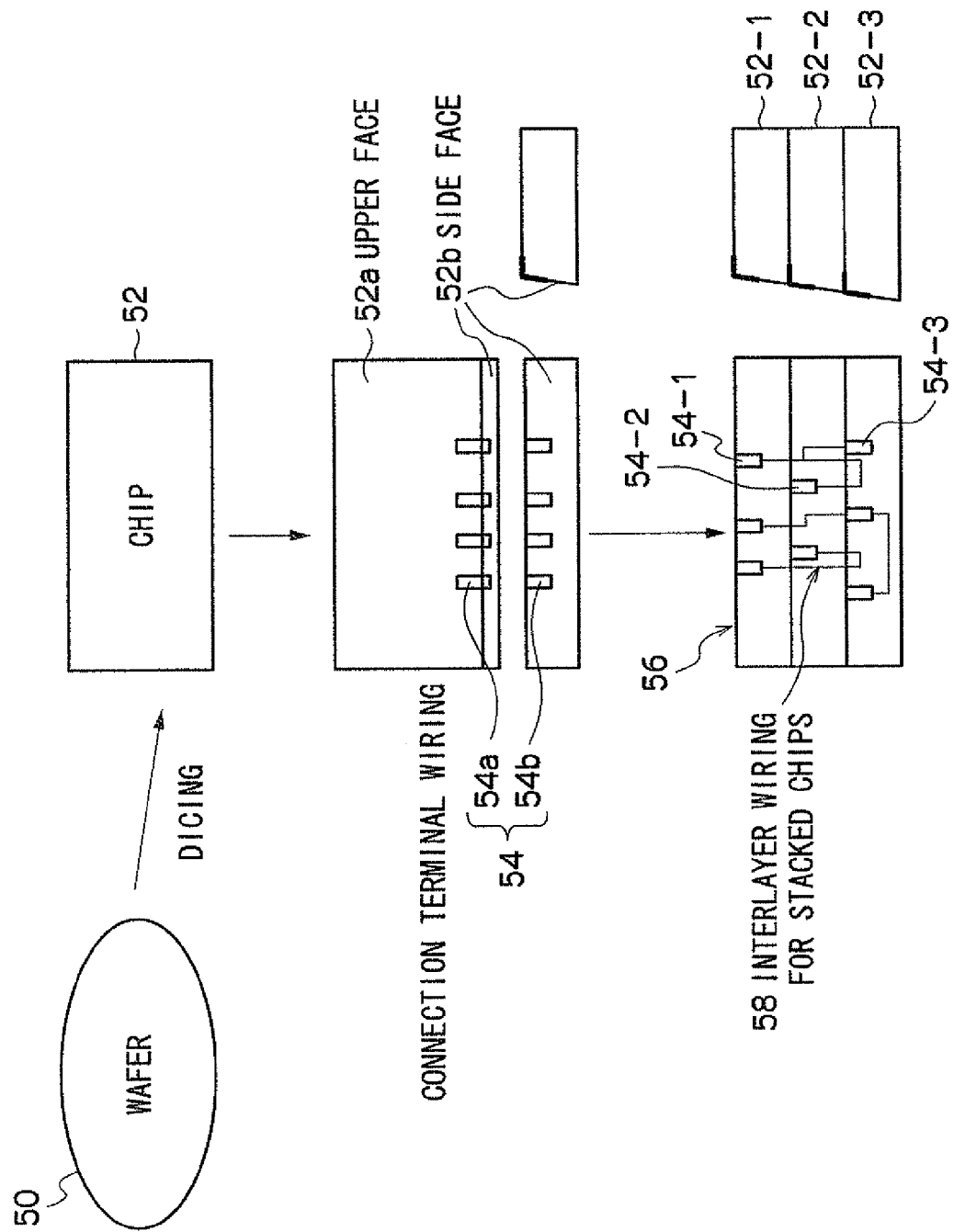
FIG. 1 is a schematic view showing a process for manufacturing a three-dimensional semiconductor chip module according to an embodiment.

Although FIG. 1 shows a case in which one out of four side faces is a side face on which the connection terminal 54 is to be formed, it is to be understood that the connection terminals 54 may be provided on an arbitrary number of side faces.

The semiconductor chips 52-1 to 52-3 for respective layers are stacked and integrated by adhesion or the like. The side face (it is intended that the stacked faces become a flat face as a whole) of a three-dimensional semiconductor chip module 56 formed in this manner is in a state where only the connection terminals 54-1 to 54-3 of the semiconductor chips 52-1 to 52-3 in the respective layers are formed, and interlayer wiring 58 is formed to electrically connect these connection terminals 54-1 to 54-3 in different layers in a predetermined wiring pattern.

In a case where the angle formed by the front face 52a and the side face 52b of each semiconductor chip 52 is an obtuse angle, the side face in each layer just needs to be inclined so that the side faces in the respective layers may become a flat face as a whole.

Also, even when the side faces in the respective layers cannot form a flat face as a whole due to production tolerance in the semiconductor chips 52 in the respective layers to produce unevenness, the following measures are preferable to enable to alleviate the negative effect of the unevenness. That is, it is only necessary to attach the respective layers by applying more adhesive for adhesion among the respective layers than the amount required for mere adhesion and form protrusion of the adhesive so as to alleviate the unevenness by the protrusion of the adhesive.

Figure 5:
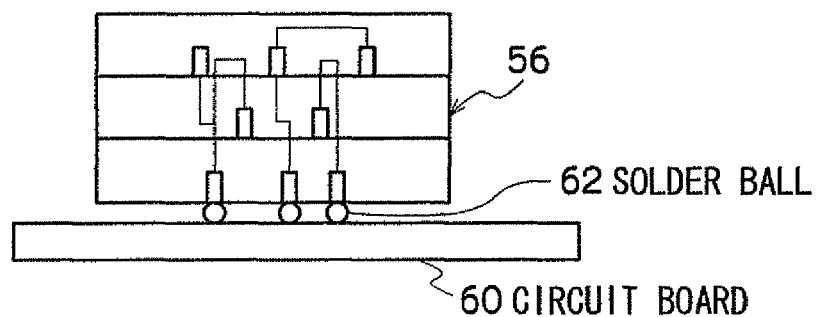
FIG. 5 is a schematic view showing a state of attaching the three-dimensional semiconductor chip module according to the embodiment to a circuit board.

The three-dimensional semiconductor chip module 56 formed in the above manner is mounted on a circuit board 60, with the connection terminals in the lowermost layer coupled with terminals and wiring patterns of the circuit board 60 for mounting the three-dimensional semiconductor chip module 56 via solder balls 62, as shown in FIG. 5.

(A-3) Process for Forming Terminal of Semiconductor Chip

Figure 6:
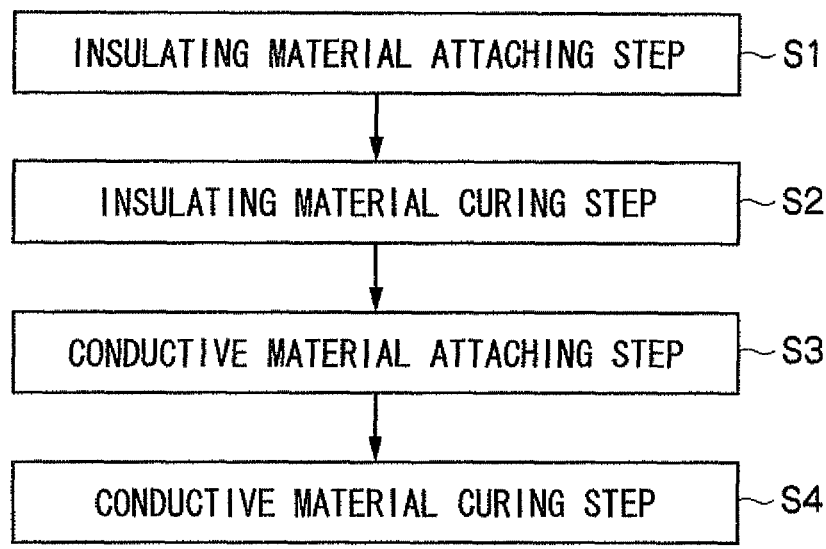
FIG. 6 is a flowchart showing a process for forming a terminal of a semiconductor chip according to the embodiment.

Next, a process for forming a connection terminal on a semiconductor chip is explained in details with reference to a flowchart in FIG. 6.

The process for forming a connection terminal includes an insulating material attaching step S1, an insulating material curing step S2, a conductive material attaching step S3, and a conductive material curing step S4 in this order. It is noted that different steps may be processed in parallel.

The insulating material attaching step S1 is a step of attaching an insulating material to a partial area of a predetermined area to which a connection terminal is provided. The insulating material curing step S2 is a step of curing the insulating material attached to the semiconductor chip 52. The conductive material attaching step S3 is a step of attaching a conductive material that serves as a connection terminal. The conductive material curing step S4 is a step of curing the conductive material attached to the semiconductor chip 52.

Figure 7:
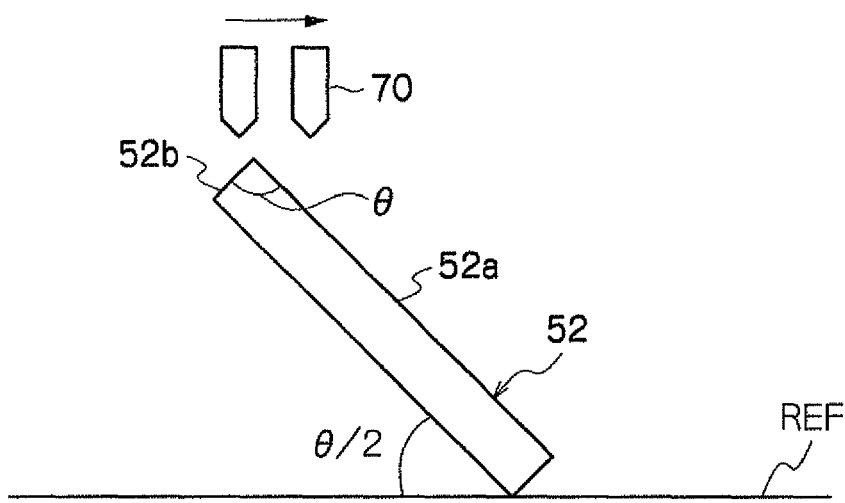
FIG. 7 is a schematic view showing a positional relationship between the semiconductor chip and a nozzle in the process for forming a terminal of a semiconductor chip according to the embodiment.

In any of the steps, the semiconductor chip is installed so that the front face 52a of the semiconductor chip 52 may be at a predetermined angle with a reference plane REF, and so that the side face on which the connection terminal 54 is provided is on the far side from the reference plane REF with use of a dedicated inclined mounting table, a mounting jig, etc., for example, as shown in FIG. 7. The predetermined angle is theta/2 in a case where the angle formed by the front face 52a and the side face 52b of the semiconductor chip 52 is theta, for example. When theta is 90 degrees, the installation angle is 45 degrees. It is to be noted that a nozzle 70 shown in FIG. 7 differs with the step and jets a different material.

In the insulating material attaching step S1, an insulating material in a mist state is jetted from the nozzle 70 shown in FIG. 7, for example. At this time, the jetting nozzle 70 and the semiconductor chip 52 are moved relatively. The relative movement of the nozzle 70 jetting the insulating material against the semiconductor chip 52 is linear movement (or reverse movement) traveling from the side face 52b of the semiconductor chip 52 via the edge to a predetermined position on the front face 52a, and with one sequential mist jet process, the insulating material is attached to an area (except a connection area with a circuit pattern) approximately covering an area on which the connection terminal 54 is to be provided. Meanwhile, in a case where a stable insulating layer has been provided on the front face of the semiconductor chip 52 on which the connection terminal 54 is to be provided by a process at the time of forming the circuit pattern of the semiconductor chip 52, the insulating material may be attached only to the side face 52b of the semiconductor chip 52.

Meanwhile, prior to the insulating material attaching step S1, the aforementioned purifying process may be performed. Also, the insulating material attaching step S1 may adopt an attachment method other than the mist jet process. For example, a method of applying an insulating material paste may be applied.

A curing method in the insulating material curing step S2 is not limited. In the insulating material curing step S2, an ultraviolet irradiation head (not shown) may follow the nozzle 70 jetting the insulating material to cure the insulating material attached to the semiconductor chip 52, for example. Also, the semiconductor chip 52 to which the insulating material has been attached may pass through a tunnel in the inside of which ultraviolet is irradiated to cure the insulating material, for example.

In the conductive material attaching step S3, a conductive material that serves as a connection terminal 54 is attached to the semiconductor chip 52 by the paste material attaching unit 18 of the aforementioned wiring forming apparatus 10 adopting the mist jet process. That is, at the same time as jetting the mist-like conductive material from the nozzle 70 shown in FIG. 7, the jetting nozzle 70 and the semiconductor chip 52 are moved relatively, to attach the conductive material that serves as a connection terminal 54 in a line form by one sequential mist jet process.

Figure 8:
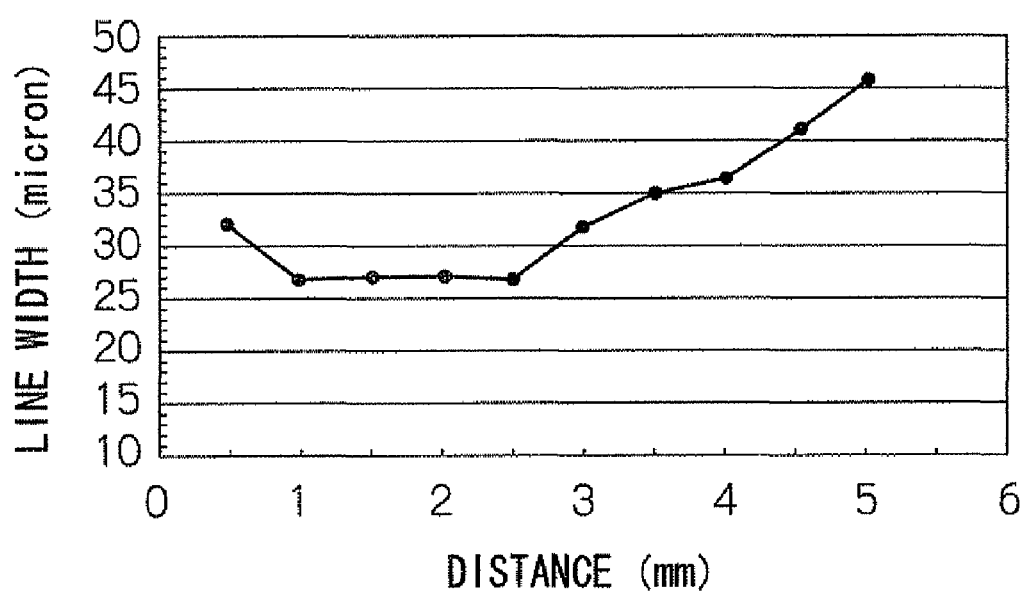
FIG. 8 is a graph showing a relationship between the distance from the nozzle tip end to the jetted surface and the line width of the formed wiring in a mist jet unit applicable in the embodiment.

As described above, in the case of the mist jet process, jet from the nozzle 70 can be narrowed jet formed in a spiral shape to form linear wiring. FIG. 8 is a graph showing a relationship between the distance from the nozzle tip end to the jetted surface and the line width of the formed wiring in an experiment in which a commercially available mist jet unit for repair of a disconnected portion on a liquid crystal panel or the like is adopted in the conductive material attaching step S3. This graph shows that controlling the distance between the nozzle 70 and the semiconductor chip 52 can achieve a desired line width by the mist jet process. One end of the connection terminal 54 on the side face may be widened to function as a pad.

The conductive material curing step S4 is one in which the conductive material attached to the semiconductor chip 52 is cured by the oxygen radical molecule jetting unit 20 of the aforementioned wiring forming apparatus 10 and is completed as a connection terminal 54.

Here, by preceding the nozzle for attaching the insulating material and the irradiation head for curing the insulating material before the nozzle for attaching the conductive material and relatively moving, against the semiconductor chip 52, the nozzle for attaching the insulating material, the irradiation head for curing the insulating material, the nozzle for attaching the conductive material, and the nozzle for curing the conductive material as a set, the respective steps in the process for forming a connection terminal can be performed in parallel.

Figure 9:
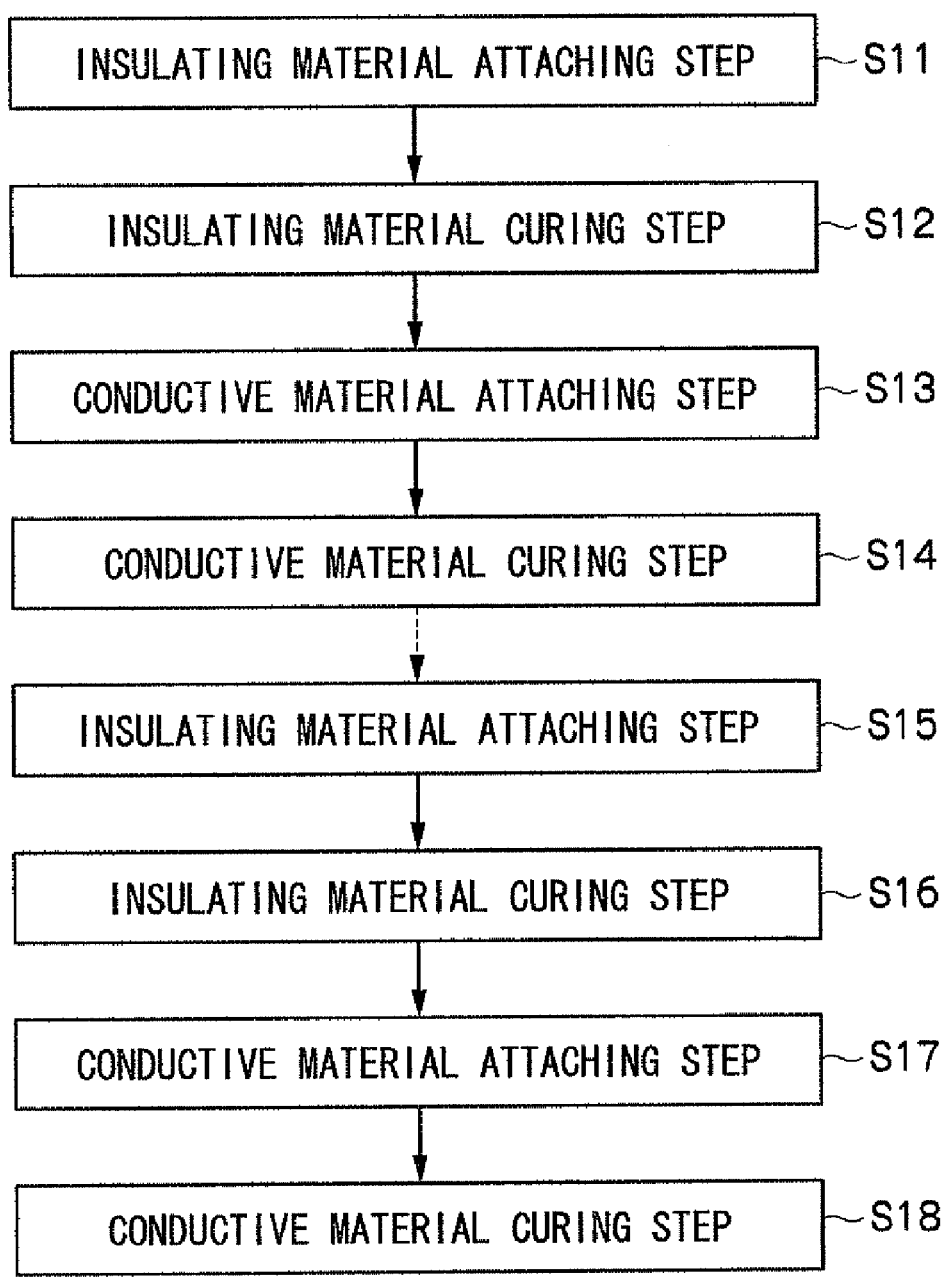
FIG. 9 is a flowchart showing a process for forming wiring among semiconductor chips of a semiconductor chip module in the embodiment.

(A-4) Process for Forming Wiring Among Semiconductor Chips of Semiconductor Chip Module Next, a process for forming wiring among semiconductor chips (among layers) of a semiconductor chip module is explained in details with reference to a flowchart in FIG. 9.

The process for forming wiring among semiconductor chips also includes an insulating material attaching step S11, an insulating material curing step S12, a conductive material attaching step S13, and a conductive material curing step S14 in this order. Here, in a case where intersection exists in wiring to be formed, an insulating material attaching step S15, an insulating material curing step S16, a conductive material attaching step S17, and a conductive material curing step S18 are further required to form wiring on the upper side in the intersection. It is noted that different steps may be processed in parallel.

The insulating material attaching steps S11, S15, the insulating material curing steps S12, S16, the conductive material attaching steps S13, S17, and the conductive material curing steps S14, S18 are processes similar to the similar steps S1, S2, S3, S4 in the process for forming a terminal of a semiconductor chip, respectively.

Meanwhile, since an object on which wiring is formed is a whole side face of a three-dimensional semiconductor chip module 58 having the connection terminals 54, the whole side face needs to be opposed to the various nozzles.

Also, a wiring pattern to be formed in the process for forming wiring among semiconductor chips may be arbitrary as shown in FIG. 5, and formation of such an arbitrary wiring pattern is executed by controlling the positions of the various nozzles by an NC (numerical control) system, for example.

The method for forming the insulating pattern is not limited to the above method. For example, instead of the insulating material attaching step S11 and the insulating material curing step S12 or the insulating material attaching step S15 and the insulating material curing step S16, the following method for forming the insulating pattern may be applied. An insulating film (polyimide, glass, etc.) on which holes (including elongated holes) have been opened at necessary parts by laser in advance is attached to the side face to insulate the parts. In this case, wiring is provided on the insulating film.

(A-5) Effect of Embodiment

With the above embodiment, since the connection terminal on the front face and the side face of the semiconductor chip is formed continuously by one-time forming operation to which the mist jet process has been applied, the terminal portion on the front face and the terminal portion on the side face are connected reliably. Consequently, electrical characteristics (e.g., resistance values) in the terminal become within a desired range.

Here, the angle formed by the front face and the side face of the semiconductor chip is made to be an obtuse angle, and the edge separating the front face and the side face is chamfered, thus to enable to exert the above effect more.

Also, with the above embodiment, using the mist jet process can form an arbitrary wiring pattern on the side face of the semiconductor chip module on which the connection terminals of the respective semiconductor chips are provided.

By doing so, the connection terminals of the semiconductor chips that are not adjacent to each other can be connected directly, for example. As a result, the degree of freedom in assignment of a circuit to each semiconductor chip can be heightened, and the degree of freedom in position of the connection terminal of each semiconductor chip can be heightened. That is, the degree of freedom in design can be heightened.

Also, since an arbitrary wiring pattern can be formed on the side face on which the connection terminals of the respective semiconductor chips are provided, providing the connection terminal only on the front face and the side face of each semiconductor chip as mentioned above can achieve electrical connection among the layers.

(B) Other Embodiments

Although the above embodiment has shown formation of a connection terminal so as to go across the front face and side face of a semiconductor chip, the connection terminal may be formed so as to go across the front face, side face, and back face of the semiconductor chip. For example, by moving the rotation center while rotating the semiconductor chip, the connection terminal can be formed so as to go across the front face, side face, and back face by one-time forming operation.

Also, although the above embodiment has shown formation of a connection terminal that is electrically connected to a circuit pattern on the front face, a connection terminal that is not electrically connected to a circuit pattern on the front face may be formed. That is, a connection terminal exerting a heat release effect may be formed.

Further, although the above embodiment has shown that a connection terminal of each semiconductor chip to which a process for forming wiring among semiconductor chips (among layers) is applied has been formed by the process explained in the above embodiment, the connection terminal may be formed by a method similar to a conventional one.

Still further, although the above embodiment has shown a three-dimensional semiconductor chip module, on which a wiring pattern is to be formed, whose number of side faces is one face, the number of side faces of the three-dimensional semiconductor chip module on which a wiring pattern is to be formed may be two or more faces. In such a modification example, wiring patterns on different side faces (or may be all side faces) may be formed at the same time. For example, a nozzle dedicated to each side face is used for each side face to perform simultaneous formation (in this case, the three-dimensional semiconductor chip module may be supported with use of the upper face and the lower face, for example).

INDUSTRIAL APPLICABILITY

A stacked package element, a method for forming a terminal of a stacked package element, a stacked package, and a method for forming a stacked package according to the present invention can target a three-dimensional semiconductor chip module (LSI module) and its component, a semiconductor chip (LSI), for example. Also, a stacked package element, a method for forming a terminal of a stacked package element, a stacked package, and a method for forming a stacked package according to the present invention can be applied to another stacked package such as a stacked printed wiring board.

The invention claimed is:

1. A stacked package comprising a plurality of package elements, each package element having a front face and a side face, the side face having a portion of a connection terminal thereon, the connection terminal being coupled with a circuit pattern formed on the front face,
    wherein the plural package elements are stacked and bonded together to form the stacked package,
    wherein the side face and front face of each package element join at an obtuse angle,
    wherein the side faces of the package elements meet to define a unitary planar surface of the stacked package which is inclined relative to a top surface of the stacked package and which extends from the top surface to a bottom surface of the stacked package, and
    wherein connection terminal portions on the side faces of said respective stacked package elements are interconnected by a wiring pattern on the side faces.

2. A stacked package according to claim 1 wherein the connection terminals extend from the front face to terminal ends on the side faces, wherein each terminal end is located on a side face of one package element intermediate the front face and bottom face of the one element, and wherein the terminal ends of different package elements are interconnected by the wiring pattern on the side faces.

3. A stacked package according to claim 2 wherein positions of the connection terminals on the one package element are offset relative to the positions of the connection terminals on another package element which is adjacent the one package element.

4. A plurality of package elements for stacking and bonding together to form a stacked package,
    wherein each package element has a front face, a side face, and a connection terminal which is coupled with a circuit pattern formed on the front face and which extends from the front face onto the side face,
    wherein the side face and the front face of each package element join at an obtuse angle, and
    wherein each package element is sized differently relative to other package elements whereby, when the plurality of package elements are stacked, the side faces of the plurality of package elements meet to define a unitary planar surface of the stacked package which is inclined relative to a top surface of the stacked package and which extends from the top surface to a bottom surface of the stacked package.

5. A plurality of package elements for stacking and bonding together to form a stacked package,
    wherein each package element has a front face, a side face, and a connection terminal, the connection terminal being coupled with a circuit pattern formed on the front face and extending from the front face onto the side face,
the connection terminal being formed by spraying of a conductive material onto the front face and the side face,
wherein the side face and the front face of each package element join at an obtuse angle, and
wherein each package element is sized differently relative to other package elements whereby, when the plurality of package elements are stacked, the side faces of this plurality package elements meet to define a unitary planar surface of the stacked package which is inclined relative to a top surface of the stacked package and which extends from the top surface to a bottom surface of the stacked package.

* * * * *